(12) United States Patent
Sills (10) Patent No.: US 8,988,931 B2
(45) Date of Patent: Mar. 24, 2015

(54) PERMUTATIONAL MEMORY CELLS

(71) Applicant: Micron Technology, Inc., Boise, ID (US)

(72) Inventor: Scott E. Sills, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/263,574

(22) Filed: Apr. 28, 2014

(65) Prior Publication Data

US 2014/0233293 A1    Aug. 21, 2014

Related U.S. Application Data

(62) Division of application No. 13/469,706, filed on May 11, 2012, now Pat. No. 8,711,603.

(51) Int. Cl.

| G11C 5/02 | (2006.01) |
| G11C 5/06 | (2006.01) |
| G11C 13/00 | (2006.01) |
| G11C 11/00 | (2006.01) |
| G11C 11/50 | (2006.01) |
| G11C 7/18 | (2006.01) |
| G11C 8/00 | (2006.01) |

(Continued)

(52) U.S. Cl.
CPC ........ *G11C 13/0002* (2013.01); *G11C 2213/52* (2013.01); *G11C 7/18* (2013.01); *G11C 5/02* (2013.01); *G11C 8/00* (2013.01); *G11C 13/0004* (2013.01); *G11C 11/5678* (2013.01); *G11C 8/14* (2013.01); *G11C 13/0009* (2013.01); *G11C 11/00* (2013.01); *G11C 11/50* (2013.01); *G11C 5/06* (2013.01)

USPC ............... 365/148; 365/51; 365/63; 365/163; 365/164

(58) Field of Classification Search
CPC ........ G11C 13/0004; G11C 5/02; G11C 7/18; G11C 8/14; G11C 13/0002; G11C 11/5678; G11C 13/0009; G11C 2213/52; G11C 8/00
USPC ............................ 365/51, 63, 148, 163, 164
See application file for complete search history.

(56) References Cited

U.S. PATENT DOCUMENTS

| 7,462,038 B2 | 12/2008 | Knoefler et al. |
| 7,795,606 B2 | 9/2010 | Jin et al. |

(Continued)

OTHER PUBLICATIONS

"International Application Serial No. PCT/US2013/039909, International Search Report mailed Aug. 23, 2013", 3 pgs.

(Continued)

*Primary Examiner* — Ly D Pham
(74) *Attorney, Agent, or Firm* — Schwegman Lundberg & Woessner, P.A.

(57) ABSTRACT

Various embodiments comprise apparatuses having at least two resistance change memory (RCM) cells. In one embodiment, an apparatus includes at least two electrical contacts coupled to each of the RCM cells. A memory cell material is disposed between pairs of each of the electrical contacts coupled to each of the RCM cells. The memory cell material is capable of forming a conductive pathway between the electrical contacts with at least a portion of the memory cell material arranged to cross-couple a conductive pathway between select ones of the at least two electrical contacts electrically coupled to each of the at least two RCM cells. Additional apparatuses and methods are described.

25 Claims, 6 Drawing Sheets

(51) Int. Cl.
  *G11C 11/56* (2006.01)
  *G11C 8/14* (2006.01)

(56) References Cited

U.S. PATENT DOCUMENTS

| | | |
|---|---|---|
| 8,048,755 B2 | 11/2011 | Sandhu et al. |
| 8,072,793 B2 | 12/2011 | Lee et al. |
| 8,711,603 B2 | 4/2014 | Sills |
| 2010/0093130 A1 | 4/2010 | Oh et al. |
| 2011/0095259 A1 | 4/2011 | Lee et al. |
| 2011/0117717 A1 | 5/2011 | Jin et al. |
| 2011/0220861 A1 | 9/2011 | Himeno et al. |
| 2011/0315944 A1 | 12/2011 | Sandhu et al. |
| 2012/0063193 A1 | 3/2012 | Ichihara |
| 2013/0301336 A1 | 11/2013 | Sills |

OTHER PUBLICATIONS

"International Application Serial No. PCT/US2013/039909, Written Opinion mailed Aug. 23, 2013", 7 pgs.

PERMUTATIONAL MEMORY CELLS

PRIORITY APPLICATION

This application is a divisional of U.S. application Ser. No. 13/469,706, filed May 11, 2012, which is incorporated herein by reference in its entirety.

BACKGROUND

Computers and other electronic systems, for example, digital televisions, digital cameras, and cellular phones, often have one or more memory devices to store information. Increasingly, memory devices are being reduced in size to achieve a higher density of storage capacity. Even when increased density is achieved, consumers often demand that memory devices also use less power while maintaining high speed access.

For a resistance change memory (RCM) cell that operates using discrete conductive pathways (CPs), such as filaments or filamentary connectors formed between electrical contacts of an RCM cell, multiple pathways between multiple electrical contacts are, in principle, possible. The disclosed subject matter provides a mechanism for power-law increased storage density in an RCM cell or other type of filament-based memory cell (e.g., resistive random-access memory (RRAM) cell) by making use of various combinations and permutations of multiple conductive pathways within a cell that has more than two electrical contacts (ECs).

DETAILED DESCRIPTION

The description that follows includes illustrative apparatuses (circuitry, devices, structures, systems, and the like) and methods (e.g., processes, protocols, sequences, techniques, and technologies) that embody the subject matter. In the following description, for purposes of explanation, numerous specific details are set forth in order to provide an understanding of various embodiments of the inventive subject matter. After reading this disclosure, it will be evident to those of ordinary skill in the art however, that various embodiments of the subject matter may be practiced without these specific details. Further, well-known apparatuses and methods have not been shown in detail so as not to obscure the description of various embodiments.

For a resistance change memory (RCM) cell that operates using discrete conductive pathways (CPs), such as filaments or filamentary connectors formed between electrical contacts of an RCM cell, multiple pathways between multiple electrical contacts are, in principle, possible. The disclosed subject matter provides a mechanism for power-law increased storage density in an RCM cell or other type of filament-based memory cell (e.g., resistive random-access memory (RRAM) cell) by making use of various combinations and permutations of multiple conductive pathways within a cell that has more than two electrical contacts (ECs).

Figure 1:
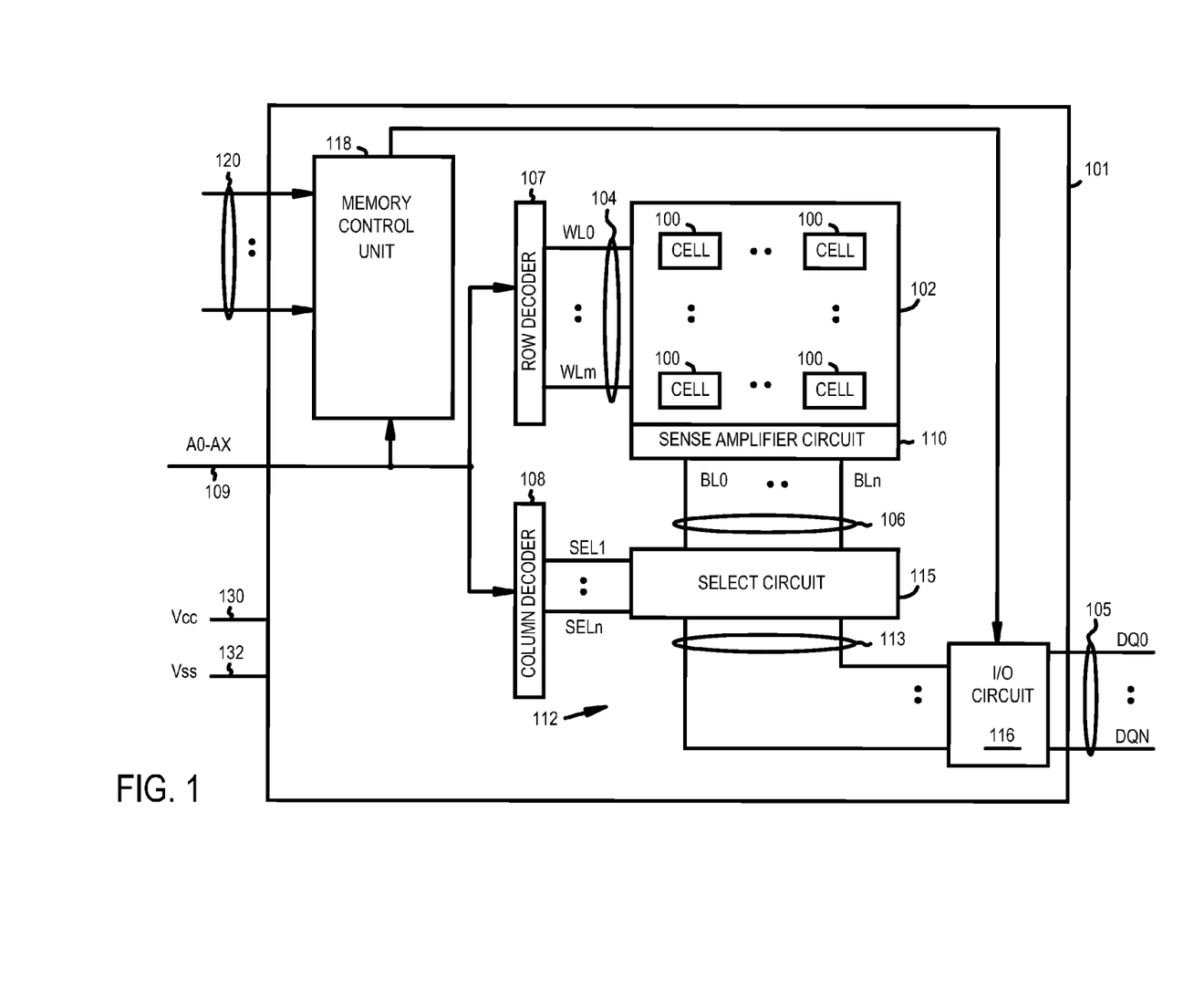
FIG. 1 is a block diagram of a memory device having a memory array with memory cells, according to an embodiment.

Referring now to FIG. 1, a block diagram of an apparatus in the form of a memory device 101 is shown. The memory device 101 includes one or more memory arrays 102 having a number (e.g., one or more) of memory cells 100 according to an embodiment. The memory cells 100 can be arranged in rows and columns along with access lines 104 (e.g., wordlines to conduct signals WL0 through WLm) and first data lines 106 (e.g., bit lines to conduct signals BL0 through BLn). The memory device 101 can use the access lines 104 and the first data lines 106 to transfer information to and from the memory cells 100. A row decoder 107 and a column decoder 108 decode address signals A0 through AX on address lines 109 to determine which ones of the memory cells 100 are to be accessed.

Sense circuitry, such as a sense amplifier circuit 110, operates to determine the values of information read from the memory cells 100 in the form of signals on the first data lines 106. The sense amplifier circuit 110 can also use the signals on the first data lines 106 to determine the values of information to be written to the memory cells 100.

The memory device 101 is further shown to include circuitry 112 to transfer values of information between the memory array 102 and input/output (I/O) lines 105. Signals DQ0 through DQN on the I/O lines 105 can represent values of information read from or to be written into the memory cells 100. The I/O lines 105 can include nodes of the memory device 101 (e.g., pins, solder balls, or other interconnect technologies such as controlled collapse chip connection (C4), or flip chip attach (FCA)) on a package where the memory device 101 resides. Other devices external to the memory device 101 (e.g., a memory controller or a processor, not shown in FIG. 1) can communicate with the memory device 101 through the I/O lines 105, the address lines 109, or the control lines 120.

The memory device 101 can perform memory operations, such as a read operation, to read values of information from selected ones of the memory cells 100 and a programming operation (also referred to as a write operation) to program (e.g., to write) information into selected ones of the memory cells 100. The memory device 101 can also perform a memory erase operation to clear information from some or all of the memory cells 100.

A memory control unit 118 controls memory operations using signals on the control lines 120. Examples of the signals on the control lines 120 can include one or more clock signals and other signals to indicate which operation (e.g., a programming operation or read operation) the memory device 101 can or should perform. Other devices external to the memory device 101 (e.g., a processor or a memory controller) can control the values of the control signals on the control lines 120. Specific combinations of values of the signals on the control lines 120 can produce a command (e.g., a programming, read, or erase command) that can cause the memory device 101 to perform a corresponding memory operation (e.g., a program, read, or erase operation).

Although various embodiments discussed herein use examples relating to a single-bit memory storage concept for ease in understanding, the inventive subject matter can be applied to numerous multiple-bit schemes as well. For example, each of the memory cells 100 can be programmed to a different one of at least two data states to represent, for example, a value of a fractional bit, the value of a single bit or the value of multiple bits such as two, three, four, or a higher number of bits.

For example, each of the memory cells 100 can be programmed to one of two data states to represent a binary value of "0" or "1" in a single bit. Such a cell is sometimes called a single-level cell (SLC).

In another example, each of the memory cells 100 can be programmed to one of more than two data states to represent a value of, for example, multiple bits, such as one of four possible values "00," "01," "10," and "11" for two bits, one of eight possible values "000," "001," "010," "011," "100," "101," "110," and "111" for three bits, or one of another set of values for larger numbers of multiple bits. A cell that can be programmed to one of more than two data states is sometimes referred to as a multi-level cell (MLC). Various operations on these types of cells are discussed in more detail, below.

The memory device 101 can receive a supply voltage, including supply voltage signals $V_{cc}$ and $V_{ss}$, on a first supply line 130 and a second supply line 132, respectively. Supply voltage signal $V_{ss}$ can, for example, be at a ground potential (e.g., having a value of approximately zero volts). Supply voltage signal $V_{cc}$ can include an external voltage supplied to the memory device 101 from an external power source such as a battery or alternating-current to direct-current (AC-DC) converter circuitry (not shown in FIG. 1).

The circuitry 112 of the memory device 101 is further shown to include a select circuit 115 and an input/output (I/O) circuit 116. The select circuit 115 can respond to signals SEL1 through SELn to select signals on the first data lines 106 and the second data lines 113 that can represent the values of information to be read from or to be programmed into the memory cells 100. The column decoder 108 can selectively activate the SEL1 through SELn signals based on the A0 through AX address signals present on the address lines 109. The select circuit 115 can select the signals on the first data lines 106 and the second data lines 113 to provide communication between the memory array 102 and the I/O circuit 116 during read and programming operations.

The memory device 101 may comprise a non-volatile memory device, and the memory cells 100 can include non-volatile memory cells, such that the memory cells 100 can retain information stored therein when power (e.g., $V_{cc}$, or $V_{ss}$, or both) is disconnected from the memory device 101.

Each of the memory cells 100 can include a memory element having material, at least a portion of which can be programmed to a desired data state (e.g., by being programmed to a corresponding resistance state). Different data states can thus represent different values of information programmed into each of the memory cells 100.

The memory device 101 can perform a programming operation when it receives (e.g., from an external processor or a memory controller) a programming command and a value of information to be programmed into one or more selected ones of the memory cells 100. Based on the value of the information, the memory device 101 can program the selected memory cells to appropriate data states to represent the values of the information to be stored therein.

One of ordinary skill in the art may recognize that the memory device 101 may include other components, at least some of which are discussed herein. However, several of these components are not shown in the figure, so as not to obscure details of the various embodiments described. The memory device 101 may include devices and memory cells, and operate using memory operations (e.g., programming and erase operations) similar to or identical to those described below with reference to various other figures and embodiments discussed herein.

Figure 2:
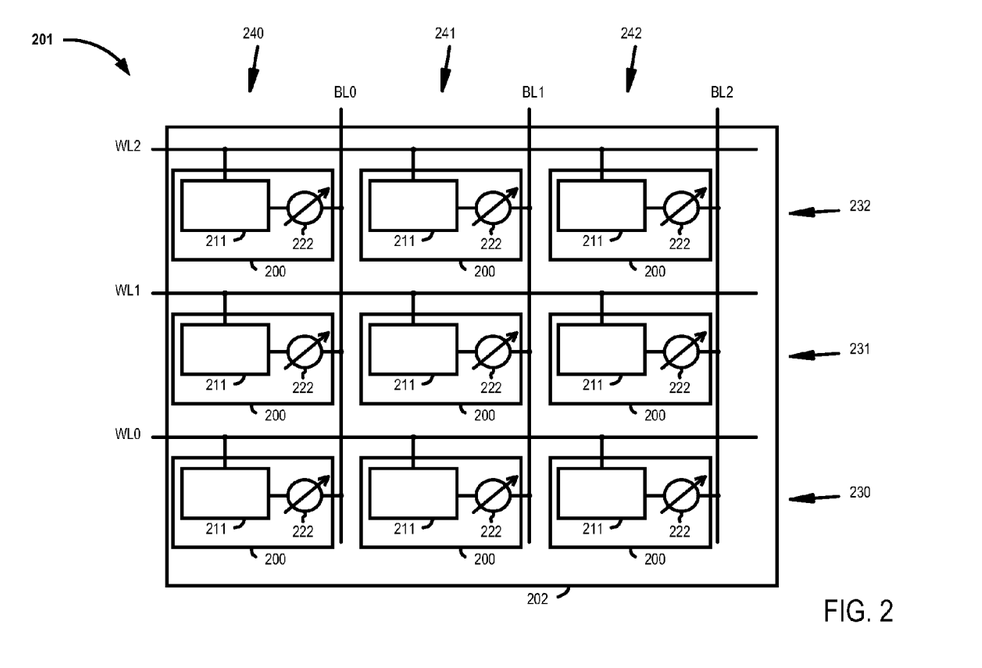
FIG. 2 is a partial block diagram of a memory device having a memory array including memory cells with access components and memory elements, according to an embodiment.

With reference now to FIG. 2, a partial block diagram of an apparatus in the form of a memory device 201 is shown to include a memory array 202, including memory cells 200 with access components 211 and memory elements 222, according to an example embodiment. The memory array 202 may be similar to or identical to the memory array 102 of FIG. 1. As further shown in FIG. 2, the memory cells 200 are shown to be arranged in a number of rows 230, 231, 232, along with access lines, for example word lines, to conduct signals to the cells 200, such as signals WL0, WL1, and WL2. The memory cells are also shown to be arranged in a number of columns 240, 241, 242 along with data lines, for example bit lines, to conduct signals to the cells 200, such as signals BL0, BL1, and BL2. The access components 211 can turn on (e.g., by using appropriate values of signals WL0, WL1, and WL2) to allow access to the memory elements 222, such as to operate the memory elements 222 as pass elements, or to read information from or program (e.g., write) information into the memory elements 222.

Programming information into the memory elements 222 can include causing the memory elements 222 to have specific resistance states. Thus, reading information from a memory cell 200 can include, for example, determining a resistance state of the memory element 222 in response to a specific voltage being applied to its access component 211. The act of determining resistance may involve sensing a current (or the absence of current) flowing through the memory cell 200 (e.g., by sensing a current of a bit line electrically coupled to the memory cell). Based on a measured value of the current (including, in some examples, whether a current is detected at all), a corresponding value of the information stored in the memory can be determined. The value of information stored in a memory cell 200 can be determined in still other ways, such as by sensing a voltage of a bit line electrically coupled to the memory cell.

Figure 3:
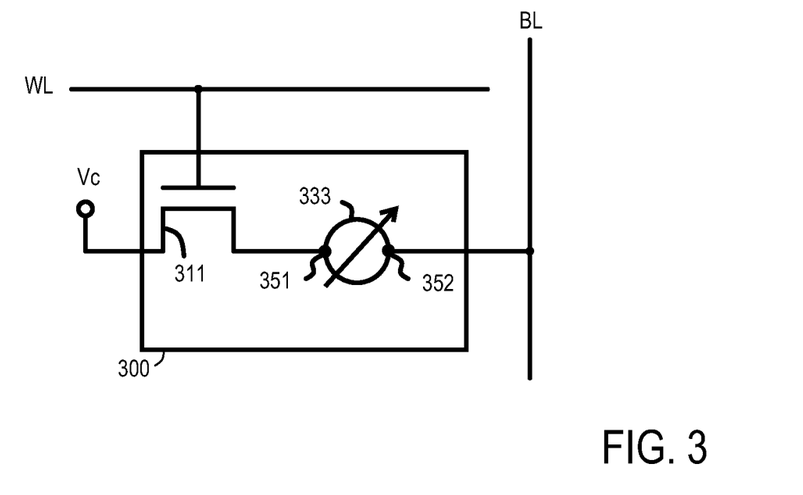
FIG. 3 is a schematic diagram of a memory cell having an access component coupled to a memory element, according to various embodiments.

FIG. 3 is a schematic diagram of a memory cell 300 having an access component 311 coupled to a memory element 333, according to various embodiments. Lines labeled WL and BL in FIG. 3 may correspond to any one of the access lines 104 and any one of the first data lines 106 of FIG. 1, respectively. FIG. 3 shows an example of the access component 311 including, for example, a metal-oxide-semiconductor field-effect transistor (MOSFET). As will be realized by a person of ordinary skill in the art, upon reading this disclosure, the memory cell 300 can include other types of access components, such as diodes, for example, or may not include any access component, as is the case with some cross-point array embodiments.

The memory element 333 may be coupled to and disposed between two electrodes, such as a first electrode 351 and a second electrode 352. FIG. 3 schematically shows these electrodes as dots. Structurally, each of these electrodes can include conductive material. The memory element 333 can include material that can be changed, for example, in response to a signal, to have a different resistance state. The value of information stored in the memory element 333 can correspond to the resistance state of the memory element 333. The access component 311 can enable signals (e.g., embodied as a voltage or current) to be transferred to and from the memory element 333 via the pairs of electrodes 351, 352 during operation of the memory cell 300, such as during read, program, or erase operations.

A programming operation may use signal WL to turn on the access component 311 and then apply a signal BL (e.g., a signal having a programming voltage or current) through the memory element 333. Such a signal can cause at least a portion of the material of the memory element 333 to change its resistance state. The change can be reversed by, for instance, performing an erase operation. For example, a localized conductive region may be formed within an electrolyte contained within the memory element 333. The formation of the localized conductive region is discussed in more detail, below, for example, with reference to FIG. 4. The lateral size of the localized conductive region can determine the resistance state of the memory cell 300, where different resistance states correspond to different data states that represent different values of information stored in the memory element 333.

A read operation may use the signal WL to turn on the access component 311 (or otherwise access the memory cell 300) and then apply a signal BL having a voltage across or a current (e.g., a read voltage or current) through the memory element 333. The read operation may measure the resistance of the memory cell 300, based on a read voltage or current, to determine the corresponding value of information stored therein. For example, in the memory cell 300, a different resistance state can impart a different value (e.g., voltage or current value) to signal BL when a read current passes through the memory elements 333. Other circuitry of the memory device (e.g., a circuit such as the I/O circuit 116 of FIG. 1) can use the signal BL to measure the resistance state of memory element 333 to determine the value of the information stored therein.

The voltage or current used during a read, program, or erase operation can be different from one another. For example, in a programming operation, the value (e.g., the voltage) of the signal (e.g., the signal BL in FIG. 3) that creates a current flowing through the memory element 333 can be sufficient to cause the material state or at least a portion of the memory element to change. The change can alter the resistance state of the memory element to reflect the value of the information to be stored in the memory element 333.

In a read operation, the value (e.g., the voltage) of the signal (e.g., the signal BL in FIG. 3) that creates a current flowing through the memory element 333 can be sufficient to create the current but insufficient to cause any portion of the memory element to change. Consequently, the value of the information stored in the memory element can remain unchanged during and after the read operation.

In an erase operation, the voltage value of the signal (e.g., the signal BL in FIG. 3) can have an opposite polarity from the voltage used in a programming operation. The signal, creating a current in this case, can therefore change, or reset, the material state of the memory element to its original state; for example, a state prior to any programming being performed on the memory cell.

Various ones or all of the memory cells 100, 200, 300 of FIGS. 1 through 3 can include a memory cell having a structure similar or identical to one or more of the memory cells described below.

Figure 4:
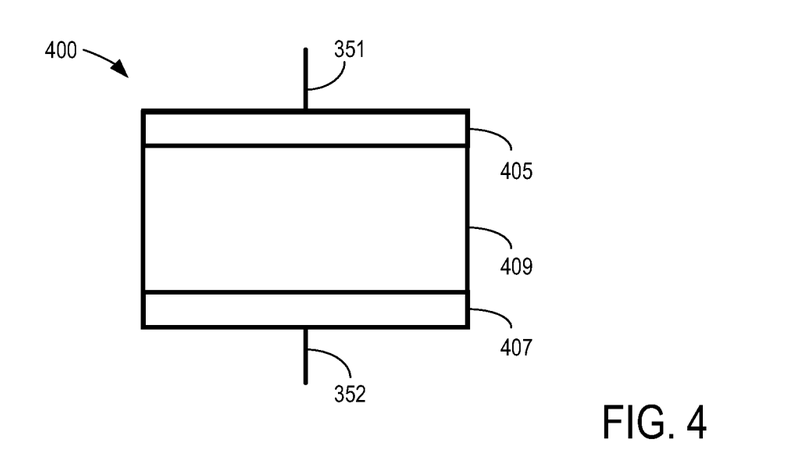
FIG. 4 is a simplified schematic block diagram of one of several types of resistance change memory (RCM) cells that may be used with the memory devices of FIGS. 1 and 2 or used to form the memory cell of FIG. 3.

For example, FIG. 4 is a simplified schematic block diagram of one of several memory cells that may be used with the memory devices of FIGS. 1 and 2, and may be similar or identical to the memory element 333 of FIG. 3. That is, the memory cell 300 may comprise a resistance change memory (RCM) cell 400. The RCM cell 400 may include a memory cell in which the change in cell resistance, and hence a memory state, is based on the formation, or removal, of a localized conductive region between the memory cell electrodes. In some RCM technologies, the localized conductive region is sometimes referred to as a conductive filament. In some embodiments, the RCM includes types of resistive random access memory (RRAM), in which the localized conductive region is formed in an oxide or chalcogenide-based memory cell material. In one embodiment, the RRAM cell is a conductive-bridging RAM (CBRAM) memory cell. In this case, operation of the RCM cell 400 is based on a voltage-driven ionic migration and electrochemical deposition of metal ions within a memory cell material 409 of the RCM cell 400. In another embodiment, the RRAM cell is based on forming and erasing a localized conductive region by electric-field driven drift of oxygen anions, or oxygen vacancies, within a transition metal oxide memory cell material.

Prior to any signal (e.g., a bias voltage) being applied to an anode 405 and a cathode 407 of the RCM cell 400, the basic construction of the RCM cell 400 is that of a metal-insulator-metal structure. In some embodiments, each RCM cell is constructed in series with a non-ohmic access device, for example, a diode, to control parasitic current pathways through unselected memory cells within a memory cell array. Prior to any voltage being applied to the anode 405, the RCM cell 400 can be considered to be in a "reset" (e.g., native) state. The reset state is a relatively high-resistance state due to the natural insulative (i.e., electrically non-conductive) nature of the memory cell material 409. By applying, for example, a positive voltage to an anode 405 of the RCM cell 400, metal ions are driven from the anode 405, through the memory cell material 409, and towards the cathode 407.

The anode 405 may be, for example, an oxidizable, fast-diffusing metallic or metallic alloy layer. The anode 405 may be comprised of various types of electrochemically active metals or metal alloys. In a specific example, the anode 405 may comprise silver (Ag), copper (Cu), Aluminum (Al), or zinc (Zn) and functions as a metallic ion donor. The cathode 407 may be a relatively inert material comprising a semiconducting or metallic material that does not possess a significant solubility or a significant mobility to provide ions to the memory cell material 409.

In a specific example, the cathode 407 may comprise platinum (Pt), tungsten (W), titanium (Ti), tantalum (Ta), titanium nitride (TiN), doped silicon (Si), tantalum nitride (TaN), or ruthenium (Ru). The memory cell material 409 may be a chalcogenide, for example, silver-doped germanium selenide (Ag—GeSe), silver-doped germanium sulfide (Ag—$GeS_2$), copper-doped germanium sulfide (Cu—$GeS_2$), or copper telluride ($CuTe_x$); or an oxide, e.g. a transition metal oxide (e.g., $ZrO_x$), a semiconductor oxide (e.g., $SiO_x$), a rare earth oxide (e.g., $YbO_x$), another metal oxide (e.g., $AlO_x$), or combinations thereof, (e.g., $ZrSiO_x$).

One advantage of the RCM cell 400 compared with more traditional memory technologies (e.g., flash memory) is that the RCM cell 400 offers the potential of scaling to smaller technology nodes, and may be operated at comparatively low power for all operations (e.g., read, program, and erase). Also, these operations may be performed at a higher speed than traditional memory.

Figure 5:
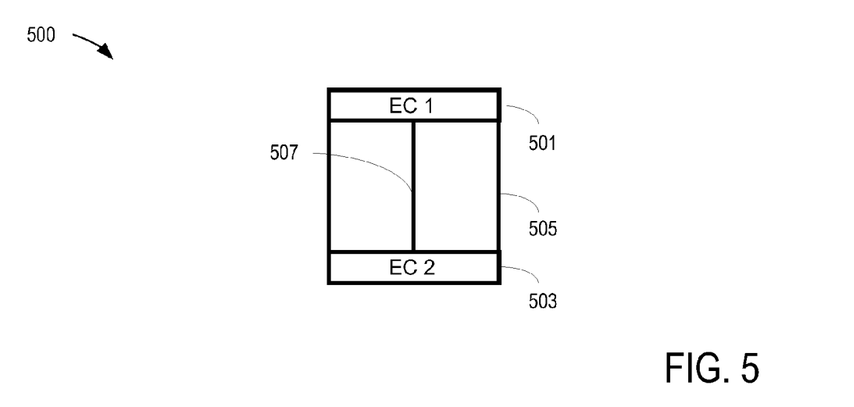
FIG. 5 illustrates a number of combinations and permutations associated with a memory cell with two electrical contacts, according to an embodiment.

Referring now to FIG. 5, the number of combinations and permutations for a memory cell 500 with two electrical contacts is illustrated. A first electrical contact 501 (EC1) and a second electrical contact 503 (EC2) are separated by, for example, a memory cell material 505. A conductive pathway 507 is shown extending from the first electrical contact 501 to the second electrical contact 503. Assuming a simple binary on/off arrangement of the memory cell 500, the conductive pathway 507 provides the only electrical coupling possible between the first electrical contact 501 and the second electrical contact 503.

As discussed briefly above, for an RCM cell that operates based on discrete CPs, multiple pathways between multiple electrical contacts are, in principle, possible. Any filament-based RCM cell technology with greater than two electrode contacts per cell can be considered.

The number of permutations for information storage increases in an approximately power-law relationship with the number of electrode contacts per cell, while the number of combinations (and program/erase and read operations) increases only approximately linearly. For a given number of electrical contacts, $N_{EC}$, on memory cells in the illustrated configuration, the maximum number of conductive pathways, $N_{CP}$, may be determined by equation (1):

$$N_{CP} = \left[\frac{3}{2}(N_{EC} - 2)\right] + 1 \quad (1)$$

The maximum number of on/off permutations, $N_{PERM}$, is provided according to the power-law relationship expressed by equation (2):

$$N_{PERM} = 2^{N_{CP}} \quad (2)$$

The number of permutations determined by equation (2) relates to a sequence, or order, of the on/off settings between various possible conductive pathway arrangements. The concept of permutations is discussed in more detail, below, with reference to Table III.

Equation (1) applies for an even number of electrical contacts. Odd numbers of electrical contacts or different geometries and arrangements of the electrical contacts may result in slightly different numbers of CPs, but the maximum number of CPs are still qualitatively similar to the results given by the conductive pathway equation (1) above, as will be explained in more detail below.

In the simple example of FIG. 5, where only two electrical contacts are present, the number of electrical contacts in the memory cell 500 is two, designated as contacts EC1 and EC2. Therefore, for two electrical contacts, the maximum number of conductive pathways is one—the conductive pathway 507 between EC1 and EC2. The number of possible permutations or ways of connecting EC1 to EC2 that are possible is also one. These possible combinations and permutations for the memory cell 500 of FIG. 5 are summarized in Table I, below.

TABLE I

Power-Law Increased Permutations of an RCM Cell

| | |
|---|---|
| Number of Electrical Contacts, $N_{EC}$ | 2 |
| Number of Conductive Pathways, $N_{CP}$ | 1 |
| Number of Possible Permutations, $N_{PERM}$ | 1 |

Therefore, the maximum number of conductive pathways and maximum number of possible permutations is only one for two electrical contacts.

Figure 6:
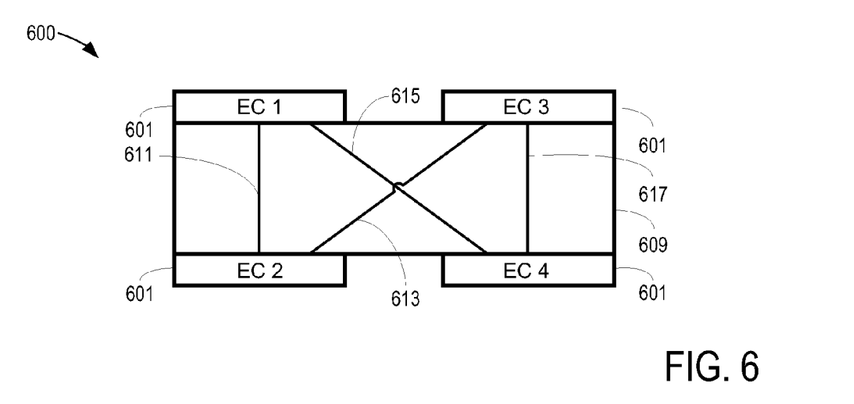
FIG. 6 illustrates a number of combinations and permutations for conductive pathways in a memory cell with four electrical contacts, according to an embodiment.

However, referring now to FIG. 6, the number of combinations and permutations for conductive pathways in a memory cell 600 with four electrical contacts is illustrated. The memory cell 600 includes four electrical contacts 601 (EC1, EC2, EC3, and EC4) and, for this example, can be considered to have two memory states ("on" or "off"). The memory cell 600 has a first conductive pathway 611 electrically coupling contacts EC1 and EC2, a second conductive pathway 613 electrically coupling contacts EC2 and EC3, a third conductive pathway 615 electrically coupling contacts EC1 and EC4, and a fourth conductive pathway 617 electrically coupling contacts EC3 and EC4. The second conductive pathway 613 electrically coupling contacts EC2 and EC3 and the third conductive pathway 615 electrically coupling contacts EC1 and EC4 may be considered to be cross-coupled conductive pathways. Note the side-view illustration of FIG. 6 does not show the three-dimensional aspect of the conductive pathway (CP) configuration. The geometric layout of the electrical contacts (EC) separates second conductive pathway 613 and the third conductive pathway 615, so that they are not physically overlapping, which could electrically short the two CPs.

An electrolyte 609 may allow growth or formation of any of the filaments or conductive pathways as discussed above with reference to FIG. 4. As shown in FIG. 6, the electrolyte 609 is formed continuously (e.g., a continuous electrolyte) between each of the four electrical contacts 601. However, in other embodiments the electrolyte 609 may not form a single continuous strand, but instead comprises a continuous portion of the electrolyte 609 that bridges each of the four electrical contacts 601 in some manner.

Applying the conductive pathway and power-law permutational relationships to the memory cell 600 of FIG. 6, for the four electrical contacts 601, the maximum number of conductive pathways is found to be four. The maximum number of possible permutations or ways of connecting the four electrical contacts 601 is 16. These possible combinations and permutations for the memory cell 600 of FIG. 6 are summarized in Table II, below.

TABLE II

Power-Law Increased Permutations of an RCM Cell

| | |
|---|---|
| Number of Electrical Contacts, $N_{EC}$ | 4 |
| Number of Conductive Pathways, $N_{CP}$ | 4 |
| Number of Possible Permutations, $N_{PERM}$ | 16 |

Therefore, the maximum number of conductive pathways for the memory cell 600 of FIG. 6, with the four electrical contacts 601, is four and the maximum number of possible permutations is sixteen. Table III, below, provides an indication of the number of combinations and the number of permutations depending on an on/off configuration state of the various combinations on electrical contacts having an "on" state conductive pathway between them.

TABLE III

| ON/OFF Configuration of All Conductive Pathways | | | | No. of Combinations | No. of Permutations |
|---|---|---|---|---|---|
| CP-1 (EC1-EC2) | CP-2 (EC2-EC3) | CP-3 (EC1-EC4) | CP-4 (EC3-EC4) | (Sum of All CP States) | (Sequence of All CP States) |
| 0 | 0 | 0 | 0 | 0 | 1 |
| 0 | 0 | 0 | 1 | 1 | 2 |
| 0 | 0 | 1 | 0 | 1 | 3 |
| 0 | 1 | 0 | 0 | 1 | 4 |
| 1 | 0 | 0 | 0 | 1 | 5 |
| 0 | 0 | 1 | 1 | 2 | 6 |
| 0 | 1 | 0 | 1 | 2 | 7 |
| 1 | 0 | 0 | 1 | 2 | 8 |
| 0 | 1 | 1 | 0 | 2 | 9 |
| 1 | 0 | 1 | 0 | 2 | 10 |
| 1 | 1 | 0 | 0 | 2 | 11 |
| 0 | 1 | 1 | 1 | 3 | 12 |
| 1 | 0 | 1 | 1 | 3 | 13 |
| 1 | 1 | 0 | 1 | 3 | 14 |
| 1 | 1 | 1 | 0 | 3 | 15 |
| 1 | 1 | 1 | 1 | 4 | 16 |

As discussed briefly above, the number of permutations relates to a sequence, or order, of, for example, reading the on/off settings between various possible conductive pathway arrangements. Therefore, as the number of on/off configuration of all conductive pathways varies from all "off" (0, 0, 0, 0), at the top of Table III, to all "on" (1, 1, 1, 1) at the bottom of Table III, the number of permutations, or sequences in which the conductive pathways can be turned on or programmed, erased, or read, increase by one for each new "on" state. Consequently, pairs of electrical contacts electrically coupled to RCM cells are configured to be accessed individually for program, erase, or read operations regardless of whether the pairs of electrical contacts are disposed directly opposite each other or cross-coupled as shown in, for example, FIG. 6 and FIG. 7.

For example, consider a situation where only CPs CP-3 and CP-4 are either "on" or "off." In this example, there are only two combinations: (1) contacts EC1 to EC4; and (2) contacts EC3 to EC4. However, there are three permutations: (1) CPs CP-3 "off" and CP-4 "off"; (2) CPs CP-3 "off" and CP-4 "on"; and (3) CPs CP-3 "on" and CP-4 "on." Therefore, there are four different ways to store a "1." These permutations can be visualized more readily with reference to rows 1 through 3 of the on/off sequence in Table III.

Note that the Tables and equations (1) and (2) provided above relate only to an on-off state. This binary simplification of the subject matter is provided merely for clarity in understanding and is not intended as a limitation. When considering multi-level cells (MLC), both combinations and permutations of multiple conductive pathways can be considered within a cell that has more than two electrical contacts (EC). For example, in MLC applications, if each conductive pathway has three states (e.g., high, medium, and low resistance states), then equation (3) applies for a three-state MLC device with four conductive pathways:

$$N_{PERM} = 3^{N_{CP}} \quad (3)$$

Consequently, for three states and four conductive pathways, $N_{PERM} = 3^4$. Thus, $N_{PERM} = 81$. In general, for an arbitrary number of memory states, $N_S$, equation (4) applies, where:

$$N_{PERM} = N_S^{N_{CP}} \quad (4)$$

Thus, applying equation (4) for a four-state MLC with four conductive pathways, $N_{PERM} = 4^4$ or $N_{PERM} = 256$; for a five-state MLC, $N_{PERM} = 5^4$ or $N_{PERM} = 625$; and so on. Therefore, a person of ordinary skill in the art, upon reading and understanding the disclosure provided herein, will appreciate the large increase in storage density that is possible by applying the permutational methods described. Further, while the number of permutations for information storage increases in a power-law relationship with the number of electrode contacts per cell, the number of combinations (and respective program/erase and read operations) increases only linearly.

Figure 7:
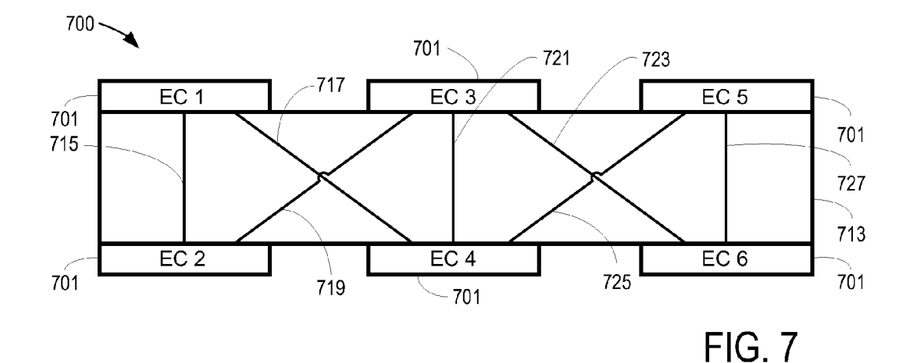
FIG. 7 illustrates a number of combinations and permutations for conductive pathways in a memory cell with six electrical contacts, according to an embodiment.

As another example, FIG. 7 illustrates the number of combinations and permutations for conductive pathways in a memory cell 700 with six electrical contacts 701 (EC1, EC2, ..., EC6). The memory cell 700, for this example, can be considered to have two memory states ("on" or "off").

The memory cell 700 has a first conductive pathway 715 electrically coupling contacts EC1 and EC2, a second conductive pathway 717 electrically coupling contacts EC1 and EC4, a third conductive pathway 719 electrically coupling contacts EC2 and EC3, a fourth conductive pathway 721 electrically coupling contacts EC3 and EC4, a fifth conductive pathway 723 electrically coupling contacts EC3 and EC6, a sixth conductive pathway 725 electrically coupling contacts EC4 and EC5, and a seventh conductive pathway 727 electrically coupling contacts EC5 and EC6.

A memory cell material 713 may allow growth or formation of any of the conductive pathways as discussed above with reference to FIG. 4. As shown in FIG. 7, the memory cell material 713 is formed continuously between each of the six electrical contacts 701. However, in other embodiments the memory cell material 713 may not form a single continuous strand, but instead may comprise a continuous portion of the memory cell material 713 that bridges each of the six electrical contacts 701 in some manner.

Applying the conductive pathway and power-law permutational relationships, equations (1) and (2) respectively, to the memory cell 700 of FIG. 7, for six electrical contacts, the maximum number of conductive pathways is found to be seven. The maximum number of possible permutations or ways of connecting the six electrical contacts 701 is 128. These possible combinations and permutations for the memory cell 700 of FIG. 7 are summarized in Table IV, below.

TABLE IV

Power-Law Increased Permutations of an RCM Cell

| | |
|---|---|
| Number of Electrical Contacts, $N_{EC}$ | 6 |
| Number of Conductive Pathways, $N_{CP}$ | 7 |
| Number of Possible Permutations, $N_{PERM}$ | 128 |

Therefore, the maximum number of conductive pathways for the memory cell 700 of FIG. 7, with the six electrical contacts 701, is seven and the maximum number of possible permutations is 128.

Notice that in FIG. 7, an assumption is made that end bits of the memory cell 700 cannot be coupled. For example, no conductive pathways from EC6 back to contacts EC1 or EC5 back to contact EC2 are shown. However, such arrangements are possible, and can be envisioned by a person of ordinary skill in the art after reading this disclosure. Further, other arrangements, discussed with reference to FIG. 8 and FIG. 9, may also be possible. For example, other electrode contact configurations may include a hexagonal close-packed (HCP) array or a cubic array of via contacts within a matrix of one or more cell materials.

In general, the number of permutations for information storage increases in a power-law relationship with the number of electrical contacts per cell. The number of combinations, and, consequently, the number of program/erase and read operations increases only linearly. Table V indicates both the power-law relationship, for $N_{PERM}$, and the linear relationship, for $N_{CP}$, using example numbers of electrical contacts, $N_{EC}$, in a two-state memory cell.

TABLE V

| $N_{EC}$ | $N_{CP}$ | $N_{PERM}$ |
|---|---|---|
| 2 | 1 | 2 |
| 4 | 4 | 16 |
| 6 | 7 | 128 |
| 8 | 10 | 1,024 |
| 10 | 13 | 8,192 |
| 12 | 16 | 65,536 |
| 14 | 19 | 524,288 |
| 16 | 22 | 4,194,304 |
| 18 | 25 | 33,554,432 |
| 20 | 28 | 268,435,456 |

Figure 8:
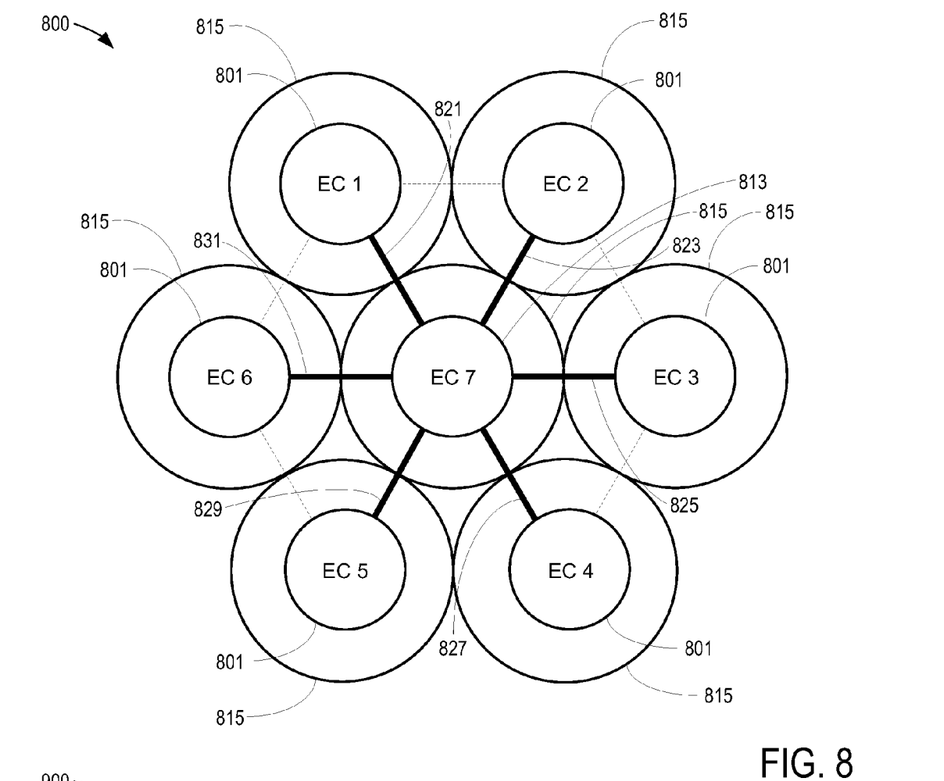
FIG. 8 is a plan-view indicating the number of combinations and permutations for conductive pathways in a memory cell with seven electrical contacts in a hexagonal close-packed array, according to an embodiment.

As another example, FIG. 8 is a plan-view drawing indicating the number of combinations and permutations for conductive pathways in a memory cell 800 with seven electrical contacts 801 (EC1, EC2, . . . , EC7) and two memory states ("on" or "off"). The seven electrical contacts 801 are arranged in a hexagonal close-packed (HCP) arrangement between individual ones of the memory cells arranged lateral to each other. The HCP arrangement of the memory cell 800 may comprise a subset of a larger $2\sqrt{3}$ $f^2$ memory cell array. The memory cell 800 has a first conductive pathway 821 electrically coupling contacts EC1 and EC7, a second conductive pathway 823 electrically coupling contacts EC2 and EC7, a third conductive pathway 825 electrically coupling contacts EC3 and EC7, a fourth conductive pathway 827 electrically coupling contacts EC4 and EC7, a fifth conductive pathway 829 electrically coupling contacts EC5 and EC7, and a sixth conductive pathway 831 electrically coupling contacts EC6 and EC7.

A memory cell material 815 may allow formation of any of the conductive pathways as discussed above with reference to FIG. 4. Although the memory cell material 815 is shown as a circular arrangement surrounding each electrical contact in the plan-view drawing of FIG. 8, the memory cell material 815 may take on any shape, such as square, rectangular, hexagonal, or even an irregular form, such as a continuous form filling voids between the seven electrical contacts 801 to bridge each of the adjacent ones of the seven electrical contacts 801. For example, as shown, the memory cell material 815 between the first electrical contact EC1 and the seventh electrical contact EC7 meet to form a conductive pathway to form between the seven electrical contacts 801. In other embodiments, the memory cell material 815 may be continuous across the entire construction of the memory cell 800.

As noted earlier, the conductive pathway equation (1) is only approximate for a non-even number of electrical contacts in the configurations illustrated in, for example, FIGS. 5 through 7. For an odd-number of electrical contacts, such as the seven electrical contacts 801 described with reference to FIG. 8, the seventh contact, EC7, is shared with the other contacts, EC1 through EC6. Therefore, the conductive pathway equation (1) is only an approximation and will vary slightly depending upon an exact geometrical arrangement of the electrical contacts. However, once the number of electrical contacts is determined, the power-law permutational relationship, equation (2), is still applicable to the memory cell 800 of FIG. 8. For the seven electrical contacts with the six conductive pathways, the maximum number of possible permutations or ways of connecting the seven electrical contacts 801 is 64. These possible combinations and permutations for the memory cell 800 of FIG. 8 are summarized in Table VI, below.

TABLE VI

Power-Law Increased Permutations of an RCM Cell

| | |
|---|---|
| Number of Electrical Contacts, $N_{EC}$ | 7 |
| Number of Conductive Pathways, $N_{CP}$ | 6 |
| Number of Possible Permutations, $N_{PERM}$ | 64 |

Figure 9:
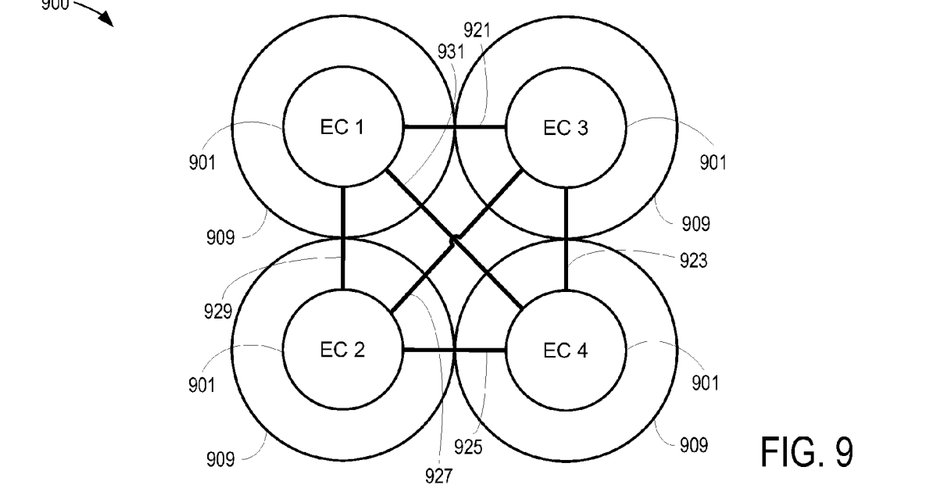
FIG. 9 is a plan-view indicating the number of combinations and permutations for conductive pathways in a memory cell with four electrical contacts in a square array, according to an embodiment.

With reference now to FIG. 9 a plan-view indicates the number of combinations and permutations for conductive pathways in the construction of a memory cell 900 with four electrical contacts 901 in a square array; individual ones of the memory cells arranged lateral to each other. The memory cell 900 may be a subset of a larger $4f^2$ memory cell array. The memory cell 900 has the four electrical contacts 901 (EC1, EC2, EC3, and EC4) and, for this example, can be considered to have two memory states ("on" or "off"). The memory cell 900 has a first conductive pathway 929 electrically coupling contacts EC1 and EC2, a second conductive pathway 931 electrically coupling contacts EC1 and EC4, a third conductive pathway 921 electrically coupling contacts EC1 and EC3, a fourth conductive pathway 927 electrically coupling contacts EC3 and EC2, a fifth conductive pathway 923 electrically coupling contacts EC3 and EC4, and a sixth conductive pathway 925 electrically coupling contacts EC4 and EC2.

Either or both of the cross-coupled conductive pathways, for example, the second conductive pathway 931 electrically coupling contacts EC1 and EC4, and the fourth conductive pathway 927 electrically coupling contacts EC3 and EC2, may be considered as optional conductive pathways. That is, depending upon a particular memory device, one or both of these conductive pathways may not be employed in a given configuration. Therefore, for the memory cell 900 of FIG. 9, there may be four, five, or six conductive pathways depending on whether a designer chooses to include one or both of the two optional cross-coupled conductive pathways. In some embodiments, all conductive pathways may not be used such as, for example, to avoid interference if the localized conductive regions cannot be sufficiently isolated when crossing the middle space.

A memory cell material 909 may allow the formation of any of the conductive pathways as discussed above with reference to FIG. 4. As with the memory cell material 815 discussed with reference to FIG. 8, the memory cell material 909 of FIG. 9 may take on any shape, such as square, rectangular, hexagonal, or irregular, even to the extent of completely filling any voids between the four electrical contacts 901 as continuous portions of the electrolyte bridging adjacent ones of the four electrical contacts 901. For example, as shown in FIG. 9, the memory cell material 909 between the first electrical contact EC1 and the fourth electrical contact EC4 meet to form a conductive pathway.

Applying the conductive pathway and power-law permutational relationships to the memory cell 900 of FIG. 9, for four electrical contacts, the maximum number of conductive pathways is either four, five, or six (depending upon whether one or both of the two optional cross-coupled conductive pathways are used). Based on the number of conductive pathways chosen, the maximum number of possible permutations or ways of connecting the four electrical contacts is then 16, 32, or 64. These possible combinations and permutations for the memory cell 900 of FIG. 9 are summarized in Table VII, below.

TABLE VII

Power-Law Increased Permutations of an RCM Cell

| | |
|---|---|
| Number of Electrical Contacts, $N_{EC}$ | 4 |
| Number of Conductive Pathways, $N_{CP}$ | 4, 5, or 6 |
| Number of Possible Permutations, $N_{PERM}$ | 16, 32, or 64 |

Based on reading and understanding the disclosure provided herein, a person of ordinary skill in the art may readily extend the techniques and concepts to any number of contacts and various arrangements of memory cells. For example, the person of ordinary skill in the art can apply the techniques and concepts to a memory cell with hundreds, thousands, or even more electrical contacts in various geometrical arrangements with other memory cells. Thus, many embodiments may be realized.

Figure 10:
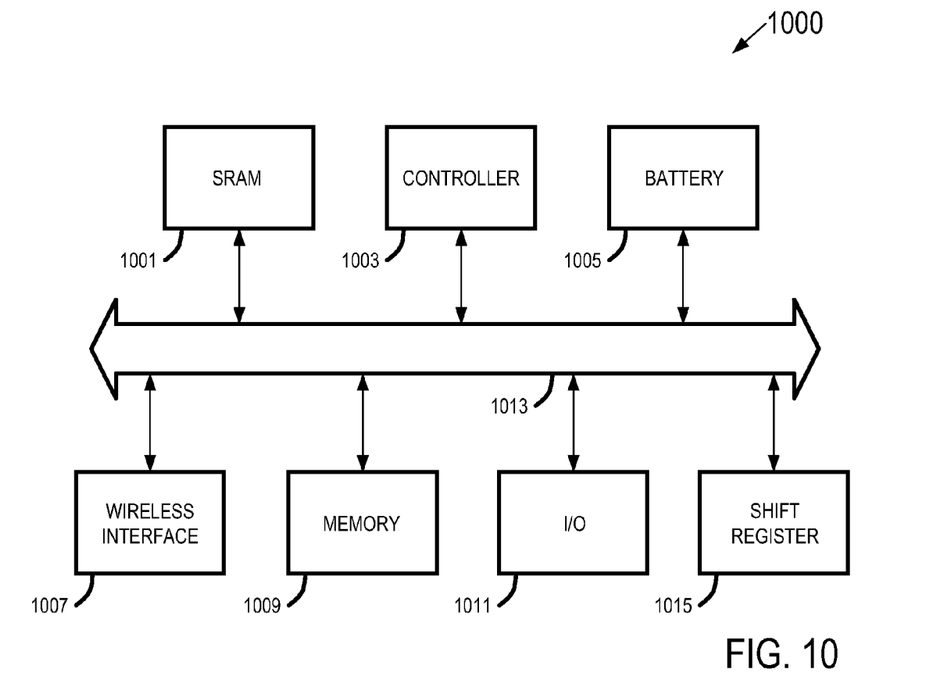
FIG. 10 is a block diagram of a system embodiment, including a memory device.

For example, a system 1000 of FIG. 10 is shown to include a controller 1003, an input/output (I/O) device 1011 (e.g., a keypad, a touchscreen, or a display), a memory device 1009, a wireless interface 1007, a static random access memory (SRAM) device 1001, and a shift register (e.g., a monolithic shift register formed using the techniques disclosed herein) coupled to each other via a bus 1013. A battery 1005 may supply power to the system 1000 in one embodiment. The memory device 1009 may include a NAND memory, a flash memory, a NOR memory, a combination of these, or the like.

The controller 1003 may include, for example, one or more microprocessors, digital signal processors, micro-controllers, or the like. The memory device 1009 may be used to store information transmitted to or by the system 1000. The memory device 1009 may optionally also be used to store information in the form of instructions that are executed by the controller 1003 during operation of the system 1000 and may be used to store information in the form of user data either generated, collected, or received by the system 1000 (such as image data). The instructions may be stored as digital information and the user data, as disclosed herein, may be stored in one section of the memory as digital information and in another section as analog information. As another example, a given section at one time may be labeled to store digital information and then later may be reallocated and reconfigured to store analog information. The controller 1003, the memory device 1009, and/or the shift register 1015 may include one or more of the novel memory devices described herein.

The I/O device 1011 may be used to generate information. The system 1000 may use the wireless interface 1007 to transmit and receive information to and from a wireless communication network with a radio frequency (RF) signal. Examples of the wireless interface 1007 may include an antenna, or a wireless transceiver, such as a dipole antenna. However, the scope of the inventive subject matter is not limited in this respect. Also, the I/O device 1011 may deliver a signal reflecting what is stored as either a digital output (if digital information was stored), or as an analog output (if analog information was stored). While an example in a wireless application is provided above, embodiments of the inventive subject matter disclosed herein may also be used in non-wireless applications as well. The I/O device 1011 may include one or more of the novel memory devices described herein.

The various illustrations of the methods and apparatuses are intended to provide a general understanding of the structure of various embodiments and are not intended to provide a complete description of all the elements and features of the apparatuses and methods that might make use of the structures, features, and materials described herein.

The apparatuses of the various embodiments may include or be included in, for example, electronic circuitry used in high-speed computers, communication and signal processing circuitry, single or multi-processor modules, single or multiple embedded processors, multi-core processors, data switches, and application-specific modules including multi-layer, multi-chip modules, or the like. Such apparatuses may further be included as sub-components within a variety of electronic systems, such as televisions, cellular telephones, personal computers (e.g., laptop computers, desktop computers, handheld computers, tablet computers, etc.), workstations, radios, video players, audio players, vehicles, medical devices (e.g., heart monitors, blood pressure monitors, etc.), set top boxes, and various other electronic systems.

A person of ordinary skill in the art will appreciate that, for this and other methods (e.g., programming or read operations) disclosed herein, the activities forming part of various methods may be implemented in a differing order, as well as repeated, executed simultaneously, with various elements substituted one for another. Further, the outlined acts and operations are only provided as examples, and some of the acts and operations may be optional, combined into fewer acts and operations, or expanded into additional acts and operations without detracting from the essence of the disclosed embodiments.

The present disclosure is therefore not to be limited in terms of the particular embodiments described in this application, which are intended as illustrations of various aspects. Many modifications and variations can be made, as will be apparent to a person of ordinary skill in the art upon reading and understanding the disclosure. Functionally equivalent methods and apparatuses within the scope of the disclosure, in addition to those enumerated herein, will be apparent to a person of ordinary skill in the art from the foregoing descriptions. Portions and features of some embodiments may be included in, or substituted for, those of others. Many other embodiments will be apparent to those of ordinary skill in the art upon reading and understanding the description provided herein. Such modifications and variations are intended to fall within a scope of the appended claims. The present disclosure is to be limited only by the terms of the appended claims, along with the full scope of equivalents to which such claims are entitled. It is also to be understood that the terminology used herein is for the purpose of describing particular embodiments only and is not intended to be limiting.

In various embodiments, an apparatus comprising at least two resistance change memory (RCM) cells is provided. The apparatus includes at least two electrical contacts coupled to each of the RCM cells. A memory cell material is disposed between pairs of each of the electrical contacts coupled to each of the RCM cells. The electrolyte is capable of forming a localized conductive pathway between the electrical contacts with at least a portion of the electrolyte arranged to cross-couple a conductive pathway between select ones of the at least two electrical contacts electrically coupled to each of the at least two RCM cells.

In at least some of the embodiments of the apparatus, pairs of each of the electrical contacts are configured to be accessed individually for program, erase, or read operations. In at least some of the embodiments of the apparatus, a number of conductive pathways to be formed between pairs of the electrical contacts increase linearly based on a total number of the electrical contacts. In at least some of the embodiments of the apparatus, a number of permutations for programming, erase, or read operations increases according to a power-law relationship based on the number of conductive pathways.

In various embodiments, an apparatus is provided that includes at least one resistance change memory (RCM) cell. The apparatus includes three or more electrical contacts electrically coupled to the RCM cell with the three or more electrical contacts arranged laterally to one another. A memory cell material is disposed between pairs of the electrical contacts. The electrolyte is capable of forming a localized conductive pathway between pairs of the three or more electrical contacts.

In some embodiments of the apparatus, at least a portion of the electrolyte is arranged to cross-couple a conductive pathway between selected ones of the electrical contacts.

In various embodiments, an apparatus is provided that includes an electrical device with at least three electrical contacts coupled to the electrical device. The three contacts are arranged laterally to one another. A memory cell material is disposed between at least pairs of the at least three electrical contacts.

In some embodiments of the apparatus, the electrical device comprises a monolithic solid-state shift register.

In various embodiments, a method of operating a memory device is provided. The method includes, in a memory device having at least three electrical contacts, selecting a sequence in which to perform a plurality of operations on the memory device, selecting a first pair of the at least three electrical contacts to perform a first operation on the memory device, and selecting a subsequent pair of cross-coupled ones of the at least three electrical contacts to perform a subsequent operation on the memory device In various embodiments, an apparatus is provided that includes at least three resistance change memory (RCM) cells. The apparatus includes at least one electrical contact electrically coupled to each of the RCM cells where the RCM cells are arranged laterally to one another. A memory cell material is disposed between at least pairs of the electrical contacts coupled to each of the at least three RCM cells. The electrolyte is capable of forming a conductive pathway between the electrical contacts.

In some embodiments of the apparatus, seven RCM cells are formed in a hexagonal close-packed array. In some embodiments of the apparatus, four RCM cells are formed in a square array.

As used herein, the term "or" may be construed in an inclusive or exclusive sense. Additionally, although various exemplary embodiments discussed below may primarily involve two-state (e.g., single-level cells (SLC)) memory devices, the embodiments are merely given for clarity of disclosure, and thus, are not limited to apparatuses in the form SLC memory devices or even to memory devices in general. For example, the disclosure provided can be readily applied to other types of electrical devices such as monolithic solid-state shift registers based on the filamentary or conductive pathways.

The Abstract of the Disclosure is provided to comply with 37 C.F.R. §1.72(b), requiring an abstract allowing the reader to quickly ascertain the nature of the technical disclosure. The abstract is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. An apparatus comprising:
   at least one resistance change memory (RCM) cell;
   three or more electrical contacts electrically coupled to the at least one RCM cell, the three or more electrical contacts arranged laterally to one another; and
   a memory cell material disposed between pairs of the three or more electrical contacts, the memory cell material capable of forming a conductive pathway between one or more of the pairs of the three or more electrical contacts.

2. The apparatus of claim 1, wherein at least a portion of the memory cell material is arranged to cross-couple a conductive pathway between select ones of the three or more electrical contacts electrically coupled to the at least one RCM cell.

3. The apparatus of claim 1, wherein the three or more electrical contacts are configured to increase a storage density of the at least one RCM cell due to a number of permutations of operating the RCM cell.

4. The apparatus of claim 1, wherein the at least one RCM cell is a multi-level memory cell configured to store more than two memory states.

5. An apparatus, comprising:
   an electrical device;
   at least three electrical contacts coupled to the electrical device, the at least three electrical contacts arranged laterally to one another and configured to be cross-coupled; and
   a memory cell material disposed between at least pairs of the at least three electrical contacts.

6. The apparatus of claim 5, wherein the memory cell material is arranged to allow cross-coupling of select ones of the at least three electrical contacts.

7. The apparatus of claim 5, wherein the electrical device comprises a monolithic solid-state shift register.

8. A method of operating a memory device, the method comprising:
  in a memory device having at least three electrical contacts,
    selecting a sequence in which to perform a plurality of operations on the memory device;
    selecting a first pair of the at least three electrical contacts to perform a first operation on the memory device; and
    selecting a subsequent pair of cross-coupled ones of the at least three electrical contacts to perform a subsequent operation on the memory device.

9. The method of claim 8, wherein at least one of the plurality of operations includes performing a resistance measurement of the memory device.

10. The method of claim 8, wherein a maximum number of selected ones of the sequence is approximately described by a power-law relationship.

11. An apparatus comprising:
  at least three resistance change memory (RCM) cells;
  a number of electrical contacts including at least one electrical contact electrically coupled to each of the at least three RCM cells, the at least three RCM cells arranged laterally to one another; and
  a memory cell material disposed between at least pairs of the at least one electrical contact electrically coupled to each of the at least three RCM cells, the memory cell material capable of forming a conductive pathway between one or more of the at least pairs of the electrical contacts.

12. The apparatus of claim 11, wherein at least a portion of the memory cell material is arranged to cross-couple a conductive pathway between select ones of the at least one electrical contact electrically coupled to each of the at least three RCM cells.

13. The apparatus of claim 11, wherein the RCM cells are formed in a hexagonal close-packed array.

14. The apparatus of claim 11, wherein the RCM cells are formed in a square array.

15. An apparatus, comprising:
  at least one resistance change memory (RCM) cell;
  three or more pairs of electrical contacts coupled to the at least one RCM cell, a first side of the pairs being arranged laterally to one another in a first plane and an opposing side of the pairs being arranged laterally to one another in a second plane; and
  a memory cell material disposed between opposing sides of the pairs of the three or more electrical contacts, the memory cell material being configured to form a conductive pathway between one or more of the pairs, each of the three or more pairs being configured to be accessed individually for at least one operation including program, erase, and read operations.

16. The apparatus of claim 15, wherein a number of conductive pathways to be formed between the pairs of the three or more pairs of electrical contacts increase approximately linearly based on a total number of the electrical contacts.

17. The apparatus of claim 16, wherein a number of permutations for the programming, erase, and read operations is to increase approximately according to a power-law relationship based on the number of conductive pathways.

18. The apparatus of claim 15, wherein the RCM cell comprises a conductive-bridging random access memory (CBRAM) cell.

19. The apparatus of claim 15, wherein the at least one RCM cell comprises a resistive random access memory (RRAM) cells.

20. The apparatus of claim 15, wherein the at least one RCM cell comprises a single-level cell memory device.

21. The apparatus of claim 15, wherein the at least one RCM cell comprises a multi-level cell memory device.

22. The apparatus of claim 15, wherein the memory cell material comprises a chalcogenide material.

23. The apparatus of claim 15, wherein at least one of the three or more pairs of electrical contacts is an anode comprising an oxidizable metallic material.

24. The apparatus of claim 15, wherein at least one of the three or more pairs of electrical contacts is a cathode comprising an inert material.

25. An apparatus, comprising:
  at least one resistance change memory (RCM) cell;
  three or more pairs of electrical contacts coupled to the at least one RCM cell, a first side of the pairs being arranged laterally to one another in a first plane and an opposing side of the pairs being arranged laterally to one another in a second plane; and
  a memory cell material disposed between opposing sides of the pairs of the three or more electrical contacts, the memory cell material capable of forming a conductive pathway between one or more of the pairs, at least a portion of the memory cell material being configured to cross-couple a conductive pathway between select ones of the pairs of the three or more electrical contacts, the three or more pairs of electrical contacts being configured to increase a storage density of the at least one RCM cell due to a number of permutations of operating the RCM cell.

* * * * *